(12) United States Patent
Miyata

(10) Patent No.: US 8,823,593 B2
(45) Date of Patent: Sep. 2, 2014

(54) ANTENNA CHARACTERISTIC MEASURING SYSTEM AND ANTENNA CHARACTERISTIC MEASURING METHOD

(75) Inventor: Kuniyuki Miyata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 549 days.

(21) Appl. No.: 13/191,576

(22) Filed: Jul. 27, 2011

(65) Prior Publication Data

US 2012/0038522 A1    Feb. 16, 2012

(30) Foreign Application Priority Data

Aug. 16, 2010   (JP) ................................. 2010-181623

(51) Int. Cl.
*G01R 29/10*   (2006.01)
(52) U.S. Cl.
USPC ............................................................. 343/703
(58) Field of Classification Search
CPC . G01R 29/0878; G01R 29/10; G01R 31/2822
USPC ................................. 343/703, 754; 455/67.11
See application file for complete search history.

(56) References Cited

U.S. PATENT DOCUMENTS

| | | | | |
|---|---|---|---|---|
| 5,119,105 | A | * | 6/1992 | Ngai et al. ...................... 343/703 |
| 6,329,953 | B1 | * | 12/2001 | McKivergan ................... 343/703 |
| 8,115,693 | B2 | * | 2/2012 | Salsman et al. ................ 343/703 |
| 8,547,284 | B2 | * | 10/2013 | Kim ................................ 343/703 |
| 2010/0273433 | A1 | * | 10/2010 | Ozaki et al. ................. 455/67.11 |

FOREIGN PATENT DOCUMENTS

| | | |
|---|---|---|
| CN | 101510806 A | 8/2009 |
| JP | 2005-61949 | 3/2005 |
| JP | 2008-89567 | 4/2008 |

OTHER PUBLICATIONS

Chinese Office Action issued Dec. 26, 2013 in corresponding Chinese Patent Application No. 201110268084.3.
Office Action issued Nov. 26, 2013 in corresponding Japanese Patent Application No. 2010-181623.
Chinese Office Action issued Sep. 4, 2013 in corresponding Chinese Application No. 201110268084.3.
Chinese Office Action issued May 15, 2014 in corresponding Chinese Patent Application No. 201110268084.3.

* cited by examiner

*Primary Examiner* — Tan Ho
(74) *Attorney, Agent, or Firm* — Staas & Halsey LLP

(57) ABSTRACT

There is provided an antenna characteristic measuring system which includes a measuring point scanner to scan a measuring point, an antenna gain measuring device which measures an antenna gain of a measured antenna at a plurality of the measuring points, determines a reference point among the plurality of the measuring points, and obtains antenna gain difference values between the antenna gain at the reference point and each of the antenna gain at the plurality of the measuring points other than the reference point, and an antenna characteristic measuring device which measures a reference antenna characteristic of the measured antenna at the reference point and obtains an antenna characteristic of the measured antenna at each of the plurality of the measuring points other than the reference point by correcting the reference antenna characteristic with each of the difference values.

6 Claims, 7 Drawing Sheets

ANTENNA CHARACTERISTIC MEASURING SYSTEM AND ANTENNA CHARACTERISTIC MEASURING METHOD

CROSS-REFERENCE TO RELATED APPLICATION

This application is based upon and claims the benefit of priority of the prior Japanese Patent Application No. 2010-181623, filed on Aug. 16, 2010, the entire contents of which are incorporated herein by reference.

FIELD

The embodiments discussed herein are related to an antenna characteristic measuring system and an antenna characteristic measuring method of measuring antenna characteristics.

BACKGROUND

A measurement is often carried out for obtaining the communication performance, such as receiving sensitivity or radiation power, including the antenna characteristics of mobile communication equipment such as a cell phone, a communication equipment built-in notebook personal computer and the like. At the measurement, it may be important to clarify the influence on an antenna from the circuit and the structure of the mobile communication equipment as an object to be measured in an anechoic chamber.

In measuring communication performance of mobile communication equipment as mentioned above, spherical measurement is adopted to measure the electromagnetic field emitted from the communication equipment over a spherical surface around measured equipment (equipment to be measured), thereby the measurement at all solid angles around the communication equipment may be permitted.

Japanese Laid-open Patent Publication No. 2008-89567 has proposed a technique of measuring antenna radiation characteristics by concentrating the radiation power from a measured antenna (an antenna to be measured) on an upper semispherical surface using a reflector. Japanese Laid-open Patent Publication No. 2005-61949 has proposed an electromagnetic wave measuring box that the inside of a shield chamber is shaped into a spherical form using a reflector.

SUMMARY

According to an aspect of the invention, an antenna characteristic measuring system includes a measuring point scanner to scan a measuring point, an antenna gain measuring device which measures an antenna gain of a measured antenna at a plurality of the measuring points, determines a reference point among the plurality of the measuring points, and obtains antenna gain difference values between the antenna gain at the reference point and each of the antenna gain at the plurality of the measuring points other than the reference point, and an antenna characteristic measuring device which measures a reference antenna characteristic of the measured antenna at the reference point and obtains an antenna characteristic of the measured antenna at each of the plurality of the measuring points other than the reference point by correcting the reference antenna characteristic with each of the difference values.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preliminary Consideration

Figure 1:
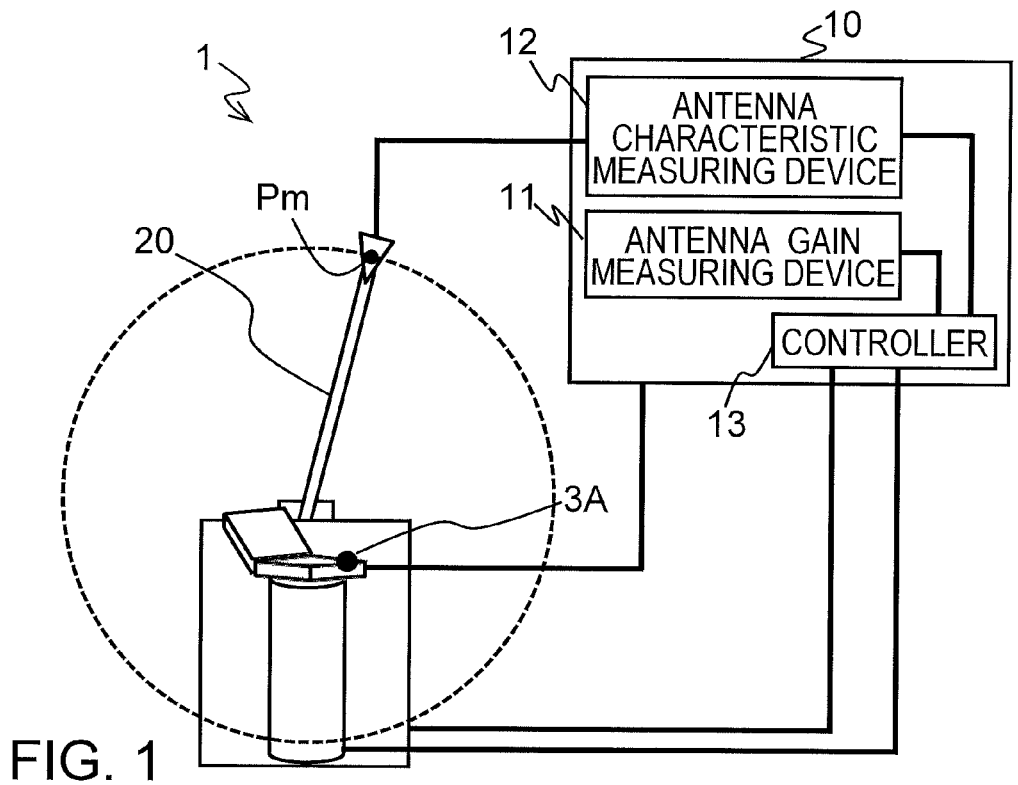
FIG. 1 is a diagram illustrating an example of a configuration of an antenna characteristic measuring system.

In spherical measurements as mentioned above, receive sensitivity and radiation powers of measured equipment are measured at a plurality of measuring points (for example, 264 measuring points) over a spherical surface surrounding the measured equipment. The received sensitivity and the radiation powers are used to evaluate the communication performance of the measured equipment over the spherical surface.

In the measurement of the receive sensitivity, first, radio waves are radiated from a measurement antenna (an antenna for measurement) to a measured antenna which is installed on measured equipment to thereby establish a communication channel between the measured equipment and a dummy base station that measures the communication performance. Then, after establishment of the channel, the reception level is obtained at which the measured equipment receives the radio wave which may cause a predetermined error rate.

For example, the reception level is reduced at every 0.1 dB (an operation of 0.1 dB), within a range of about 20 dB, of the level of received radio wave by decreasing the level of outputted radio wave from the dummy base station. The decrease of the level is continued until the error rate reaches to a specified value of the measured equipment. A minimum reception level at which the specified error rate is displayed represents the receiving sensitivity at the measuring point concerned. To which extent the reception level is to be reduced for a limit of reception may be evaluated by measuring each receiving sensitivity in the above mentioned manner.

However, receiving sensitivity measurements as mentioned above may have such a problem that since each receiving sensitivity is measured at each of all the measuring points over the spherical surface with radio waves having a plurality of frequencies, much time, for example, 26 hours per one frequency band, is taken for measurements.

Further, in the above mentioned measurements, since the reception level is reduced to the limit of reception of the measured equipment, in some cases, disconnection of communication between the measured equipment and the dummy base station may occur in the midst of each measurement. In the above mentioned case, it may become unavoidable to set again the communication and to measure again each receiving sensitivity at each measuring point. As described above, in conventional measurements of the antenna characteristics, much time may be taken for measurements and efficient measurements may not be attained.

The present invention has been made in view of the above mentioned circumstances and aims to provide an antenna characteristic measuring system configured to increase measuring efficiency by reducing time taken for measuring receive sensitivities and radiation powers at measuring points over a spherical surface.

In addition, the present invention also aims to provide an antenna characteristic measuring method by which measuring efficiency is increased by reducing time taken for measuring receive sensitivities and radiation powers at measuring points over a spherical surface.

Next, preferred embodiments of the present invention will be described with reference to the accompanying drawings. FIG. 1 is a diagram illustrating an example of a configuration of an antenna characteristic measuring system. An antenna characteristic measuring system 1 includes a measuring point scanner 20 and a measurement controller 10.

The measuring point scanner 20 scans a measuring point at which the antenna characteristics of a measured antenna (an antenna to be measured) 3A are to be measured. The measurement controller 10 includes an antenna gain measuring device 11, an antenna characteristic measuring device 12 and a controller 13.

The antenna gain measuring device 11 measures the antenna gain of the measured antenna 3A. The antenna characteristic measuring device 12 measures the antenna characteristics of the measured antenna 3A. The controller 13 controls the antenna gain measuring device 11, the antenna characteristic measuring device 12, and controls the measuring point scanner 20. The controller 13 stores various sets of data for measurements, data of currently necessary for the measurement, and the resultant data of the measurement.

The antenna gain measuring device 11 measures the antenna gain at each of the plurality of measuring points and selects one measuring point from within all the measuring points to be set as a reference point. Then, the antenna gain measuring device 11 obtains an antenna gain difference value which is a difference between the antenna gain measured at the reference point and another antenna gain measured at another measuring point.

In addition, the antenna characteristic measuring device 12 measures reference antenna characteristics which are the antenna characteristics measured at the reference point and corrects the reference antenna characteristics with the antenna gain difference value to obtain the antenna characteristics at another measuring point (the details will be described later).

Figure 2:
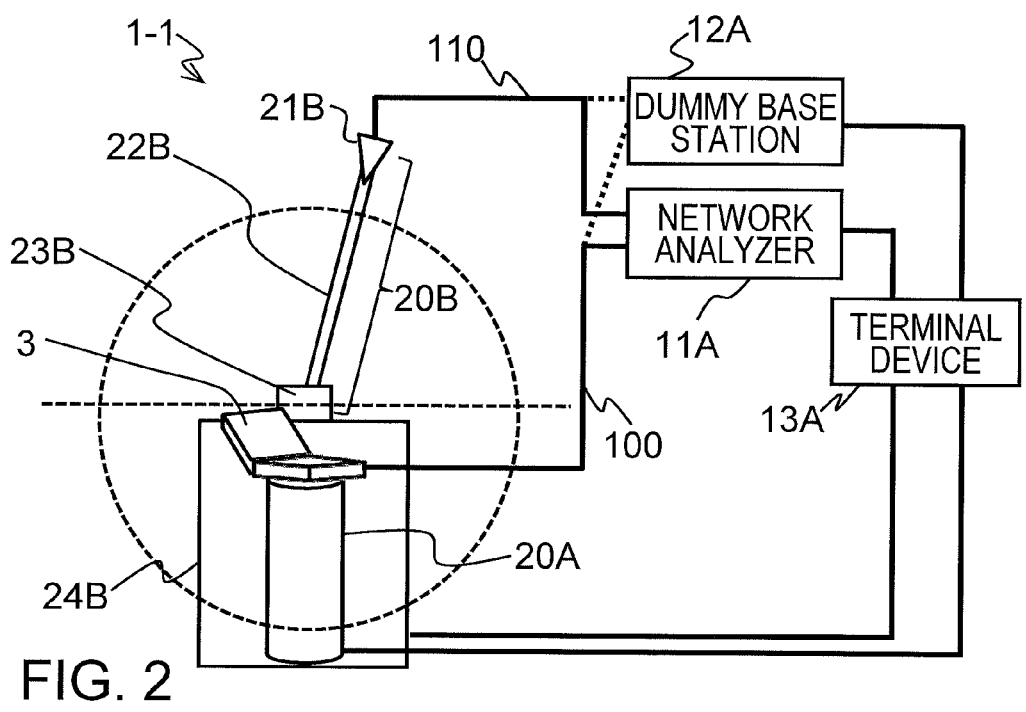
FIG. 2 is a diagram illustrating an example of a configuration of an antenna characteristic measuring system.

Next, a specific configuration of the system will be described. FIG. 2 is a diagram illustrating an example of a configuration of an antenna characteristic measuring system 1-1. An antenna characteristic measuring system 1-1 is a system which is disposed in an anechoic chamber or the like to measure the antenna characteristics at measuring points which are set over a spherical surface to be scanned.

The antenna characteristic measuring system 1-1 includes a rotating stand 20A, a measurement antenna (antenna for measurement) moving unit 20B, a network analyzer 11A, a dummy base station 12A and a terminal device 13A. Incidentally, the rotating stand 20A and the measurement antenna moving unit 20B are included in functions of the measuring point scanner 20. The network analyzer 11A corresponds to the antenna gain measuring device 11, the dummy base station 12A corresponds to the antenna characteristic measuring device 12, and the terminal device 13A corresponds to the controller 13.

The rotating stand 20A is a stand on which the measured equipment 3 is put and is made rotatable through 360 degrees in a horizontal plane direction. The measurement antenna moving unit 20B includes a measurement antenna 21B, an arm 22B, an arm driving unit 23B and an arm supporting unit 24B.

The measurement antenna 21B is attached to one end of the arm 22B and the other end of the arm 22B is disposed on the arm driving unit 23B. The arm 22B is movable in a vertical plane to move up and down the measurement antenna 21B at a position around a portion connected with the arm driving unit 23B as a center.

The network analyzer 11A is electrically coupled with the measured equipment 3 via a cable 100 and with the measurement antenna 21B via a cable 110. By changing connections of the cables 100 and 110, the dummy base station 12A is electrically coupled with the measured equipment 3 via the cable 100 and with the measurement antenna 21B via the cable 110 as illustrated by the dotted lines in FIG. 2.

The terminal device 13A is connected with the network analyzer 11A and the dummy base station 12A to control settings for the network analyzer 11A and the dummy base station 12A and controls display of a result of measurement of antenna characteristics.

The terminal device 13A is electrically coupled with the rotating stand 20A and the measurement antenna moving unit 20B to control rotational driving of the rotating stand 20A and driving of the arm 22B to perform control involving setting for scanning measuring points over the spherical surface.

Next, the measuring points will be described with reference to FIG. 3, in which an example of measuring points is illustrated. In the antenna characteristic measuring system 1-1, the antenna characteristics at all the measuring points over the spherical surface surrounding the measured equipment 3 which is put on the rotating stand 20A are evaluated.

Figure 3:
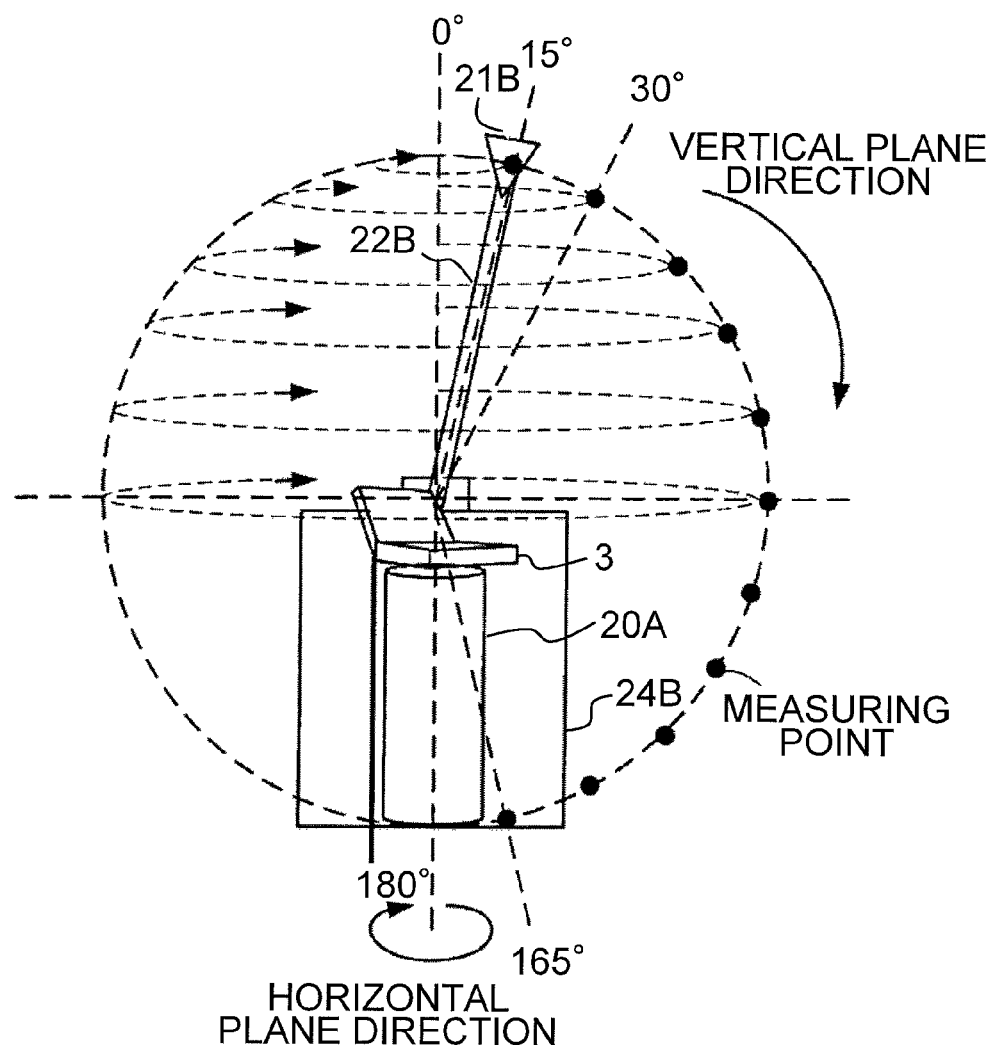
FIG. 3 is a diagram illustrating an example of measuring points.

In scanning the measuring points, for example, the measuring points are spanned at an operation of 15° for a range of 360° on a horizontal plane and at an operation of 15° for a range from to 165° on a vertical plane as illustrated in FIG. 3.

In moving the arm on the vertical plane, the moving range of the arm 22B is not set to a range from 0° to 180° and is set to a range from 15° to 165° such that the measurement antenna 21B attached to one end of the arm 22B may not be in contact with a ceiling or a floor.

Since scanning is performed at an operation of 15° for the range of 360° on the horizontal plane, the number of measuring points in the horizontal plane direction is 24. The number of measuring points which are set at an operation of 15° for the range from 15° to 165° on the vertical plane is eleven 11. Therefore, in the above mentioned situation, the number of measuring points over the spherical surface is 264 (=11×24).

As a manner of scanning the measuring points, for example, the arm 22B is set at an angle of 15° and the rotating stand 20A is rotated at an operation of 15° to scan 24 measuring points for the measurement antenna 21B which is at a 15°-position.

Likewise, the arm 22B is set at an angle of 30° in the vertical plane and the rotating stand 20A is rotated at an operation of 15° to scan 24 measuring points for the measurement antenna 21B which is at a 30° position. Since the scanning operation as mentioned above is performed until the arm 22B is set at an angle of 165°, 264 measuring points will be scanned in one-round scanning of the measuring points over the spherical surface.

Next, an antenna characteristic measuring operation will be described. As measurements of the antenna characteristics, the receiving sensitivity and the radiation power of the measured antenna 3A (hereinafter, referred to as the installed antenna 3A) which is installed on the measured equipment 3 are measured.

Figure 4:
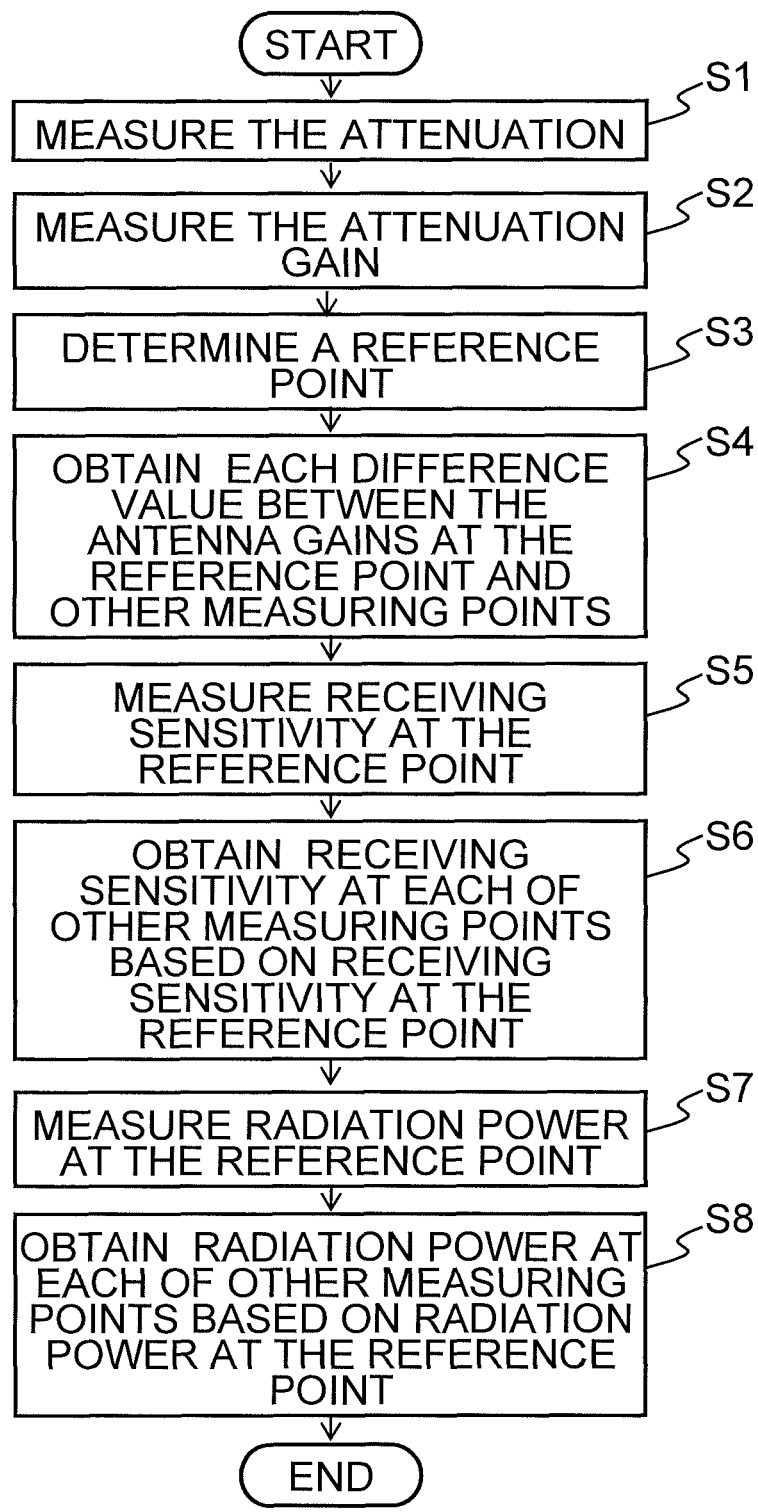
FIG. 4 is an example of a whole operation flow of an antenna characteristic measuring operation.

FIG. 4 is an example of a whole operation flow of an antenna characteristic measuring operation.

[S1]: The attenuation of the system including the space attenuation is measured.

[S2]: The attenuation measured at operation S1 is calibrated to measure antenna gains of the installed antenna 3A alone at all the measuring points over the spherical surface.

[S3]: One measuring point is selected from within all the measuring points to be set as a reference point Pr.

[S4]: A difference value $\Delta G_{Pr\text{-}Pn}$ between the antenna gain measured at the reference point Pr and the antenna gain measured at each of other measuring points Pn is obtained. Since the number of measuring points other than the reference point Pr is 263, 263 difference values $\Delta G_{Pr\text{-}Pn}$ between the antenna gains are obtained.

[S5]: A receiving sensitivity (a reference receiving sensitivity Ar) at the reference point Pr is measured.

[S6] A receiving sensitivity An at each of other measuring points Pn is estimated and calculated from the reference receiving sensitivity Ar measured at the reference point Pr. A specific calculation formula is as indicated by the following formula (1).

$$An = \Delta G_{Pr\text{-}Pn} + Ar \qquad (1)$$

Receive sensitivities An at 263 measuring points Pn other than the reference point Pr may be estimated and calculated from the receiving sensitivity calculation formula (1).

[S7]: A radiation power (a reference radiation power Br) at the reference point Pr is measured.

[S8]: Radiation powers Bn at other measuring points Pn are estimated and calculated from the reference radiation power Br measured at the reference point Pr. A specific calculation formula is as indicated by the following formula (2).

$$Bn = \Delta G_{Pr\text{-}Pn} + Br \qquad (2)$$

The radiation powers Bn at 263 measuring points Pn other than the reference point Pr may be estimated and calculated from the radiation power calculation formula (2).

Figure 5:
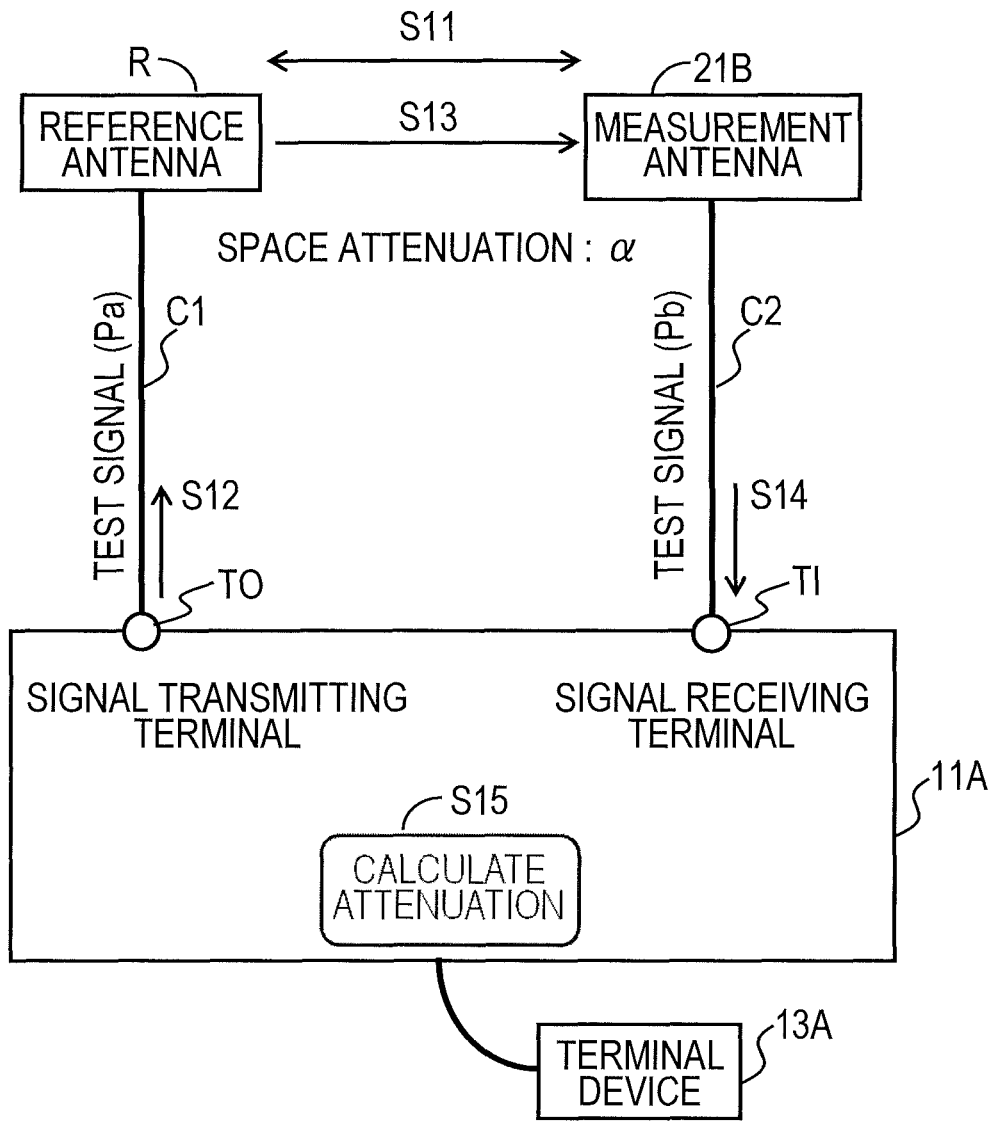
FIG. 5 is a diagram illustrating an example of a manner of measuring attenuations.

Next, attenuation measurements will be described. FIG. 5 is a diagram illustrating an example of a manner of measuring attenuations. As a connection configuration between an antenna and measuring equipment, an antenna (a reference antenna R) for measuring the attenuation of the system is electrically coupled with a signal output terminal TO of the network analyzer 11A via a cable C1. The measurement antenna 21B is electrically coupled with a signal input terminal TI of the network analyzer 11A via a cable C2.

[S11]: A distance between the reference antenna R and the measurement antenna 21B is set to a specified inter-antenna distance.

[S12]: The network analyzer 11A outputs a predetermined-frequency test signal the transmitting power of which is designated by Pa (dBm) from the signal output terminal TO to the reference antenna R via the cable C1.

[S13]: The reference antenna R transmits test radio waves toward the measurement antenna 21B and the test radio waves are received by the measurement antenna 21B.

[S14] The network analyzer 11A receives the test signal at the signal input terminal TI via the cable C2. The received power is designated by Pb (dBm).

[S15]: The network analyzer 11A calculates the apace-attenuation including attenuation of the system.

Here, when the antenna gain of the reference antenna R is designated by Gr (known), the attenuation Kn of the system is calculated using the following formula (3).

$$Kn = Pb(\text{dBm}) - Pa(\text{dBm}) - Gr \qquad (3)$$

When Gm is an antenna gain of the measurement antenna 21B, ca is a cable loss of the cable C1, cb is a cable loss of the cable C2 and $\alpha$ is a space attenuation between the reference antenna R and the measurement antenna 21B, the following relational expression (3.1) is established.

$$Kn = Pb(\text{dBm}) - Pa(\text{dBm}) - Gr = Gm - \alpha - ca - cb \qquad (3.1)$$

Figure 6:
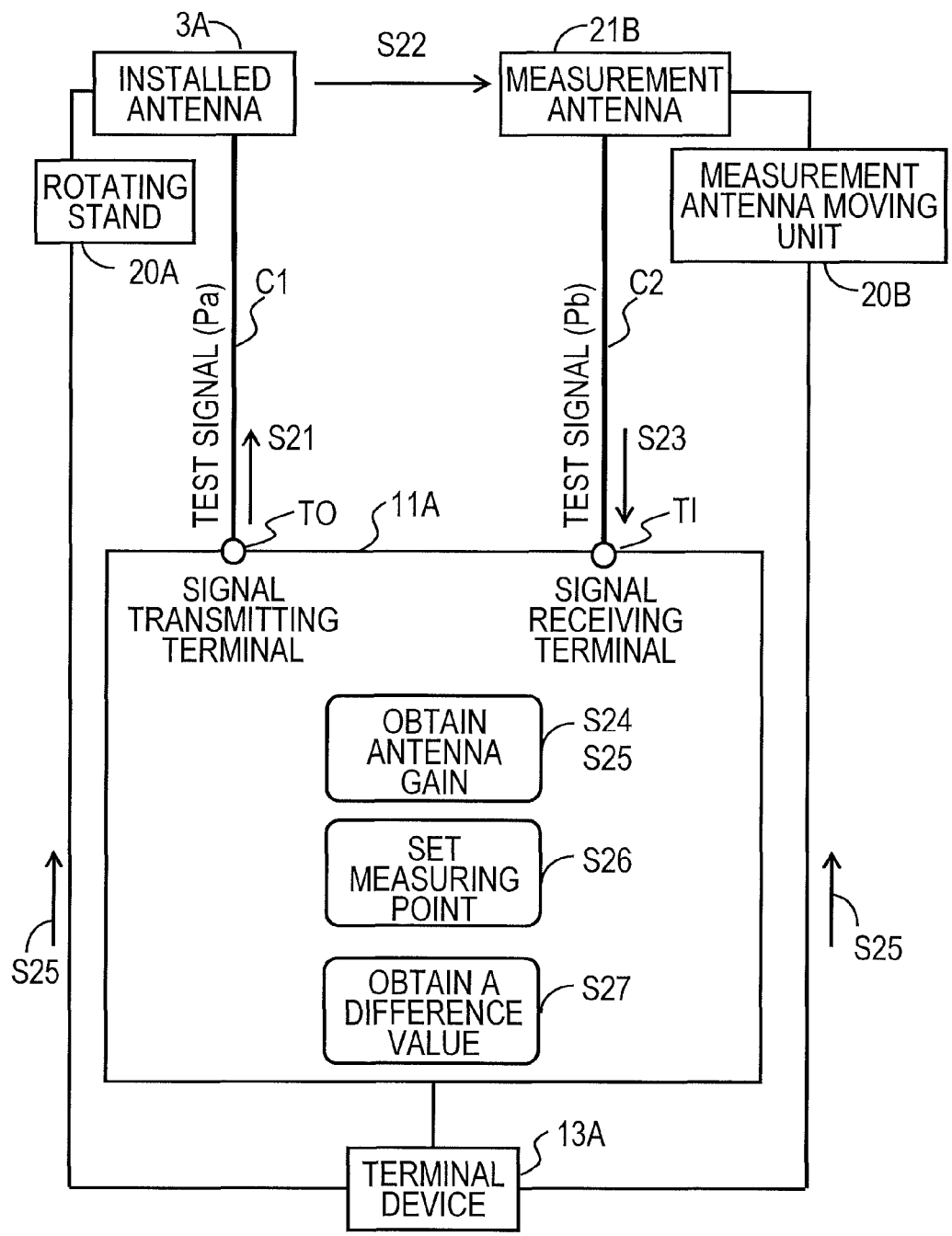
FIG. 6 is a diagram illustrating an example of a manner of measuring antenna gains.

Next, measurements of antenna gains of the installed antenna 3A alone at measuring points over the spherical surface will be described. FIG. 6 is a diagram illustrating an example of a manner of measuring antenna gains.

As a connection configuration between an antenna and measuring equipment, first, the antenna to be connected is changed from the reference antenna R to the installed antenna 3A which is installed on the measured equipment 3. In the above mentioned case, since the installed antenna 3A is connected with a communication circuit (a communication circuit board) within the measured equipment 3, the installed antenna 3A is disconnected from the communication circuit. Then, the installed antenna 3A disconnected from the communication circuit part of the measured equipment 3 is connected with the signal output terminal TO of the network analyzer 11A via the cable C1. Then, the measurement antenna 21B is connected with the signal input terminal TI of the network analyzer 11A via the cable C2. It is assumed that the measuring points are set at predetermined points over the spherical surface.

[S21]: The network analyzer 11A outputs a predetermined-frequency test signal, of which the transmitting power is designated by Pa (dBm), from the signal output terminal TO to the installed antenna 3A via the cable C1.

[S22]: The installed antenna 3A transmits test radio waves toward the measurement antenna 21B and the test radio waves are received by the measurement antenna 21B.

[S23]: The network analyzer 11A receives a test signal at the signal input terminal TI via the cable C2. The received power is designated by Pb (dBm).

[S24]: With the attenuation of the system, the network analyzer 11A calibrates the attenuation to obtain the antenna gain of the installed antenna 3A at each of the measuring points (to obtain a directional gain of the installed antenna 3A at each of the measuring points). When Gx is an antenna gain, the antenna gain Gx is obtained from the following formula (4).

$$Gx = Pd(\text{dBm}) - Pa(\text{dBm}) - Kn \qquad (4)$$

[S25]: The rotating stand 20A and the measurement antenna moving unit 20B are controlled to make the measurement point change, where the control for adjustment is performed using the terminal device 13A. The measurements that are the same as the above are sequentially performed by sequentially changing the measuring point to measure the antenna gains at 264 measuring points in total.

[S26]: One measuring point is selected from within 264 measuring points to be set as a reference point Pr, for example the measuring point at which a maximum antenna gain is obtained is set as the reference point Pr.

[S27]: A difference value $\Delta G_{Pr}\text{-}P_n$ between the antenna gain measured at the reference point Pr and the antenna gain measured at each of other measuring points Pn is obtained.

Figure 7:
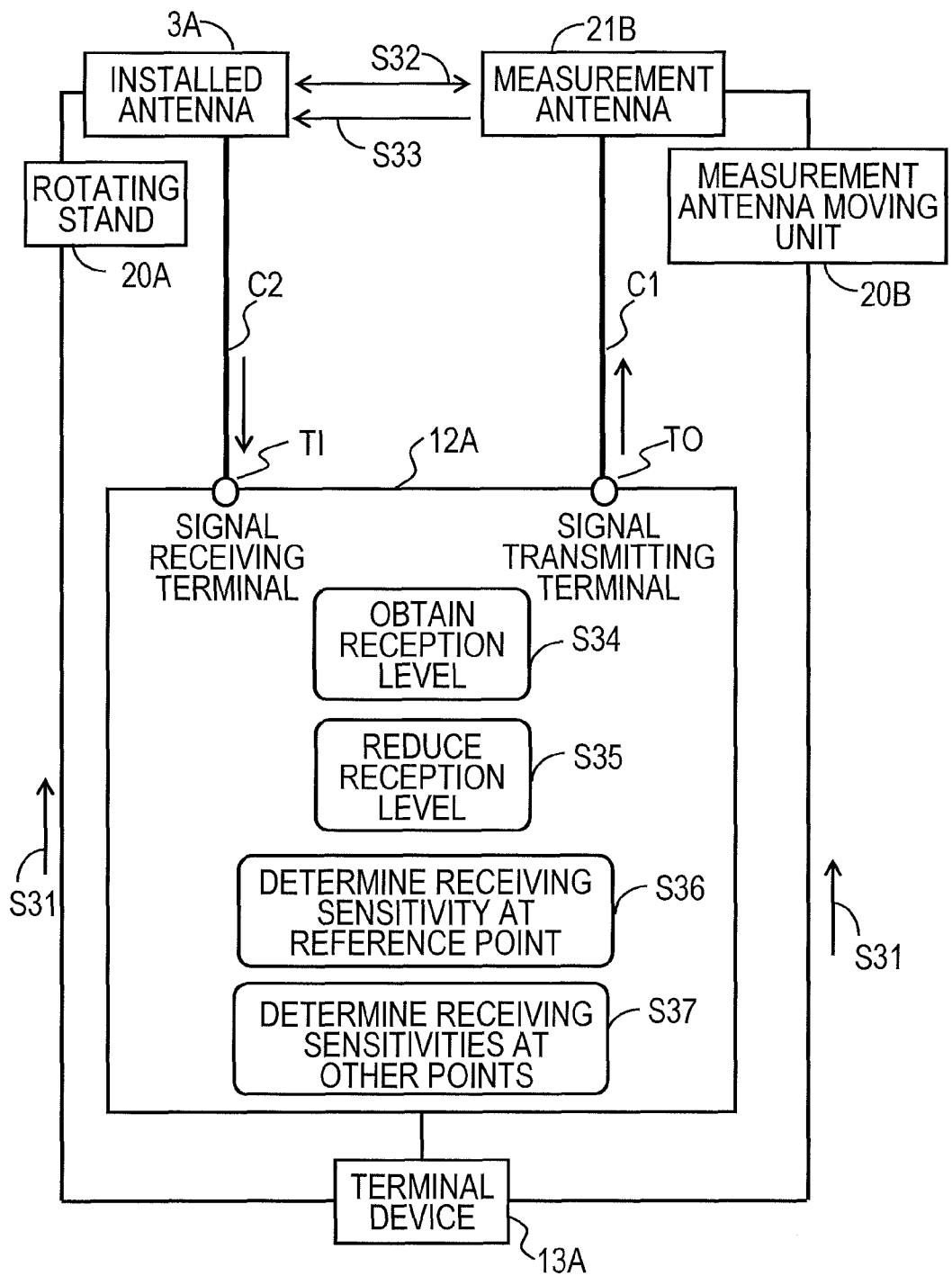
FIG. 7 is a diagram illustrating an example of a manner of measuring receive sensitivities.

Next, receiving sensitivity measurements will be described. FIG. 7 is a diagram illustrating an example of a manner of measuring the receive sensitivity. As a connection configuration between an antenna and measuring equipment, first, the connection between the installed antenna 3A and the communication circuit of the measured equipment 3 is returned to its original state.

Then, the dummy base station 12A is used in place of the network analyzer 11A and the measurement antenna 21B is electrically coupled with the signal output terminal TO of the dummy base station 12A via the cable C1. Then, the installed antenna 3A which is connected with the communication circuit of the measured equipment 3 is electrically coupled with the signal input terminal TI of the dummy base station 12A via the cable C2.

[S31]: The rotating stand 20A and the measurement antenna moving unit 20B are adjusted to set the measuring point at which the receiving sensitivity is to be measured to the reference point Pr.

[S32]: Signal transmission and reception are performed between the dummy base station 12A and the measured equipment 3 to establish a communication state (communication channel) between them.

[S33]: The dummy base station 12A transmits a test signal from the signal output terminal TO to the measurement antenna 21B to make the measurement antenna 21B radiate radio waves toward the installed antenna 3A.

[S34]: The reception level of the test signal which has been received by the installed antenna 3A via the signal input terminal TI is measured.

[S35]: The dummy base station 12A reduces and monitors the transmit level of the test signal stepwise so as to reduce the reception level which is received by the measured equipment 3 until it reaches the specified error rate of the measured equipment 3.

[S36]: The dummy base station 12A recognizes the reception level obtained when the transmit level has reached the specified error rate and then sets the reception level as a reference receiving sensitivity Ar at the reference point Pr.

[S37]: Other receive sensitivities An at other measuring points Pn are calculated from the above formula (1). For example, a receiving sensitivity A1 at the measuring point P1 is calculated using a formula An=$\Delta G_{Pr\text{-}P1}$+Ar which is derived from the formula (1). The value $\Delta G_{Pr\text{-}P1}$ has already been calculated at operation S27. Other receive sensitivities at other measuring points are calculated in the same manner as the above.

As described above, the antenna characteristic measuring system 1-1 is configured such that only the receiving sensitivity (the reference receiving sensitivity) at the reference point Pr is actually measured and each of other receive sensitivities at other measuring points is calculated by correcting the reference receiving sensitivity with the difference value between two antenna gains which have been calculated in advance at the reference point and each of other measuring points. Owing to the above mentioned configuration, the time taken for measuring the receive sensitivities may be greatly reduced and hence the measuring efficiency may be increased accordingly.

Figure 8:
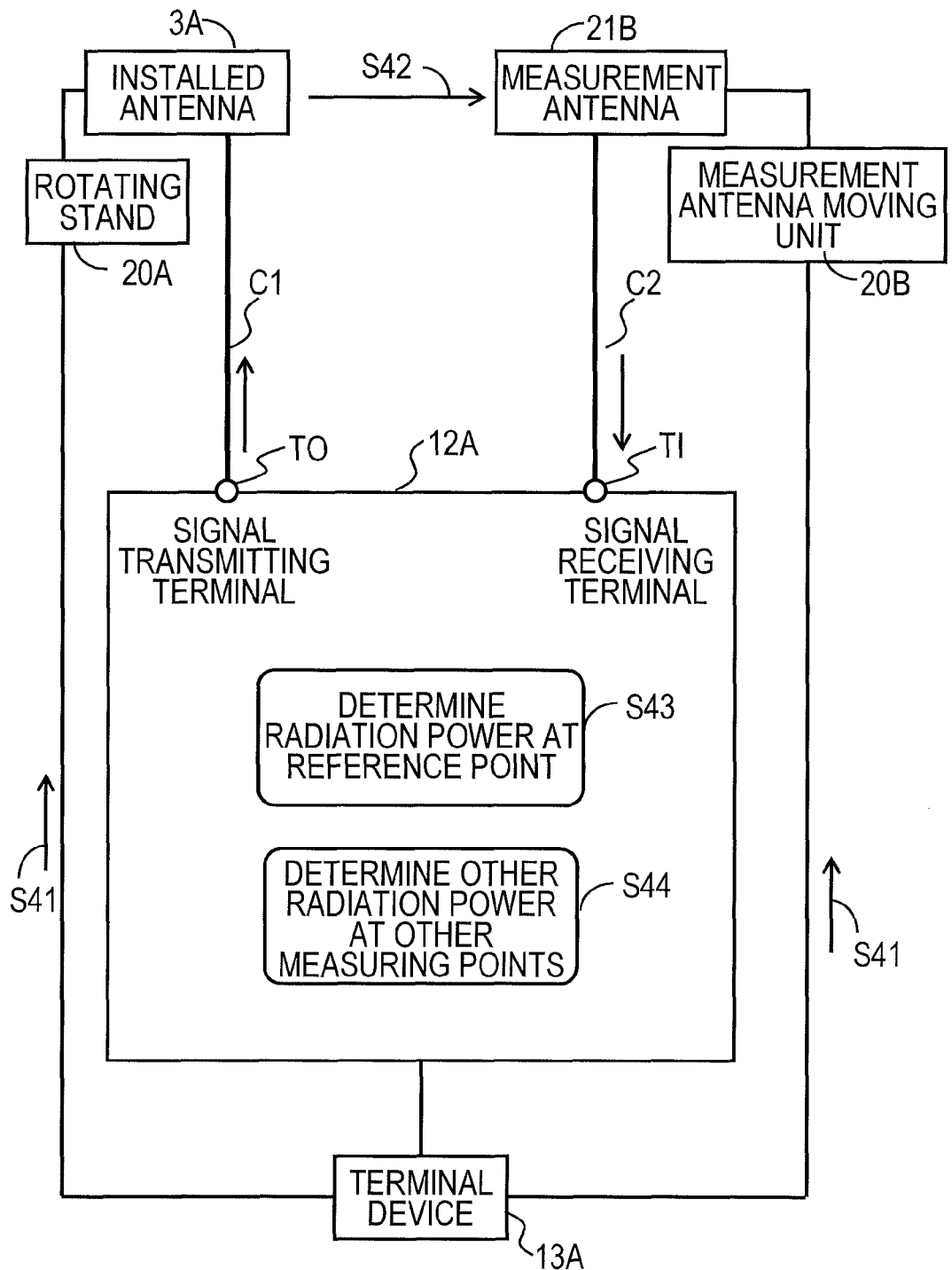
FIG. 8 is a diagram illustrating an example of a manner of measuring radiation powers.

Next, radiation power measurements will be described. FIG. 8 is a diagram illustrating an example of a manner of measuring radiation powers. As a connection configuration between an antenna and measuring equipment, the installed antenna 3A which is connected with the communication circuit part of the measured equipment 3 is connected with the signal output terminal TO of the dummy base station 12A via the cable C1. Then, the measurement antenna 21B is connected with the signal input terminal TI of the dummy base station 12A via the cable C2.

[S41]: The rotating stand 20A and the measurement antenna moving unit 20B are adjusted to set the measuring point at which the radiation power is to be measured to the reference point Pr.

[S42]: The dummy base station 12A transmits a test signal from the signal output terminal TO to the installed antenna 3A to make radio waves radiate from the installed antenna 3A toward the measurement antenna 21B.

[S43]: The reception level of the test signal which has been received by the measurement antenna 21B via the signal input terminal TI is measured to set it as a reference radiation power Br having a predetermined frequency at the reference point Pr.

[S44]: Other radiation powers Bn at other measuring points P are calculated using the above formula (2). For example, a radiation power B1 at the measuring point P1 is calculated using a formula B1=$\Delta G_{Pr\text{-}P1}$+Br which is derived from the formula (2). The value $\Delta G_{Pr\text{-}P1}$ has already been calculated at operation S27. Other radiation powers at other measuring points are calculated in the same manner as the above.

As described above, the antenna characteristic measuring system 1-1 is configured such that only the radiation power (the reference radiation power) at the reference point Pr is actually measured and each of other radiation powers at other measuring points is calculated by correcting the reference radiation power with the difference value between antenna gains which have been calculated in advance at the reference point and each of other measuring points. Owing to the above mentioned configuration, the time taken for measuring the radiation powers may be greatly reduced and hence the measuring efficiency may be increased accordingly.

As described above, the antenna characteristic measuring system is configured such that the gain of the installed antenna 3A alone which is disconnected from the communication circuit part is measured and, then its connection with the communication circuit part is returned to its original state and the reference receiving sensitivity or the reference radiation power of the entire of the measured equipment 3 at the reference point is measured. Then, the antenna characteristic measuring system is configured such that each of other receive sensitivities or radiation powers of the entire of the measured equipment 3 at other measuring points is obtained by correcting the reference receiving sensitivity or the reference radiation power with the difference value between the antenna gain at the reference point and the antenna gain at each of other measuring points.

Owing to the above mentioned configuration, it is allowed to obtain each of other antenna characteristics at other measuring points by gain-correcting the reference antenna characteristic which has been actually measured at the reference point with the difference between the antenna gain at the reference point and the antenna gain at each of other measuring points without actually measuring the antenna characteristics at other measuring points. Therefore, it may become possible to efficiently measure and evaluate the antenna characteristics such as the receiving sensitivity, the radiation power and the like over the spherical surface of the antenna which is installed on radio terminal equipment in a short period of time.

In addition, the installed antenna 3A is disconnected from the communication circuit part to measure the antenna gain of the installed antenna 3A alone. Then, its connection with the communication circuit part is returned to its original state to measure the reference antenna characteristics (the reference receiving sensitivity and the reference radiation power) of the entire of the measured equipment 3 at the reference point.

It may become possible to obtain the antenna characteristics of the installed antenna 3A which is influenced by the communication circuit part of the measured equipment 3 by performing gain correction which is based on the antenna gain of the installed antenna 3A alone on the reference antenna characteristics by performing measurements by changing the connection configuration between each antenna and the measuring equipment.

Although the embodiments have been described by giving examples thereof, another configuration having the same or similar function may be substituted for the configuration of each element described in each embodiment. In addition, other arbitrary structures and operations may be added to the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An antenna characteristic measuring system comprising:
   a measuring point scanner configured to scan a measuring point;
   an antenna gain measuring device configured to measure an antenna gain of a measured antenna at a plurality of the measuring points, to determine a reference point among the plurality of the measuring points, and to obtain antenna gain difference values between the antenna gain at the reference point and each of the antenna gains at the plurality of the measuring points other than the reference point; and
   an antenna characteristic measuring device configured to measure a reference antenna characteristic of the measured antenna at the reference point and to obtain an antenna characteristic of the measured antenna at each of the plurality of the measuring points other than the reference point on the basis of the reference antenna characteristic and each of the difference values.

2. The antenna characteristic measuring system according to claim 1, wherein, in the case of the measured antenna being electrically coupled with a communication unit in a communication device,
   the antenna gain measuring device measures the antenna gain of the measured antenna in a state of previously electrically disconnected from the communication unit, and
   the antenna characteristic measuring device measures the antenna characteristic of the measured antenna in a state of electrically connected with the communication unit.

3. The antenna characteristic measuring system according to claim 1, wherein the antenna characteristic measuring device measures a reference receiving sensitivity of the measured antenna at the reference point and to obtain a receiving sensitivity of the measured antenna at each of the plurality of the measuring points other than the reference point by correcting the reference receiving sensitivity with each of the antenna gain difference values.

4. The antenna characteristic measuring system according to claim 1, wherein the antenna characteristic measuring device measures a reference radiation power of the measured antenna at the reference point and to obtain a radiation power of the measured antenna at each of the plurality of the measuring points other than the reference point by correcting the reference radiation power with each of the antenna gain difference values.

5. The antenna characteristic measuring system according to claim 1, further comprising a measuring controller which includes the antenna gain measuring device and the antenna characteristic measuring device.

6. A method for measuring an antenna characteristic comprising:
   scanning a measuring point at which the antenna characteristic of a measured antenna is measured;
   measuring an antenna gain of the measured antenna at a plurality of the measuring points;
   determining a reference point among the plurality of the measuring points and obtaining antenna gain difference values between the antenna gain at the reference point and each of the antenna gain at the plurality of the measuring points other than the reference point; and
   measuring a reference antenna characteristic of the measured antenna at the reference point; and
   obtaining an antenna characteristic of the measured antenna at each of the plurality of the measuring points other than the reference point by correcting the reference antenna characteristic with each of the difference values.

* * * * *